(12) United States Patent
Tsai

(10) Patent No.: US 7,297,010 B2
(45) Date of Patent: Nov. 20, 2007

(54) ELECTRICAL CONNECTOR HAVING VERTICALLY MOVABLE TERMINALS

(76) Inventor: Chou Hsuan Tsai, 15F, No. 4, Lane 127, Sec. 1, Fu-Hsing Rd., Hsin-Chuang (TW)

( * ) Notice: Subject to any disclaimer, the term of this patent is extended or adjusted under 35 U.S.C. 154(b) by 0 days.

(21) Appl. No.: 11/226,529

(22) Filed: Sep. 13, 2005

(65) Prior Publication Data

US 2006/0063429 A1    Mar. 23, 2006

(51) Int. Cl.
*H01R 13/62*    (2006.01)

(52) U.S. Cl. ...................... 439/331; 439/862

(58) Field of Classification Search ........... 439/331, 439/73, 862, 66, 632, 83
See application file for complete search history.

(56) References Cited

U.S. PATENT DOCUMENTS 6,652,329 B1 *  11/2003  Howell et al. .............. 439/862
6,814,586 B1 *  11/2004  Ju .................................. 439/66
6,971,902 B2 * 12/2005  Taylor et al. ................ 439/342

\* cited by examiner

*Primary Examiner*—Tho D. Ta
*Assistant Examiner*—Vanessa Girardi
(74) *Attorney, Agent, or Firm*—Pro-Techtor Int'l Services

(57) ABSTRACT

An electrical connector includes a base and terminals. The base is formed with terminal slots in which the terminals are disposed. Each terminal slot has first and second walls, and third and fourth walls. Each terminal includes a fixing portion, an elastic arm and a pin portion. The fixing portion presses against and is positioned by the terminal slot. The fixing portion has first and second plates that are folded. The first plate contacts the first wall of the terminal slot. The elastic arm is connected to a top of the second plate. The elastic arm extends upward in a direction toward the fixing portion. A connection point is formed on the elastic arm close to a free end of the elastic arm. The pin portion, which is formed by prodding and pressing the fixing portion, extends toward a bottom of the base.

11 Claims, 6 Drawing Sheets

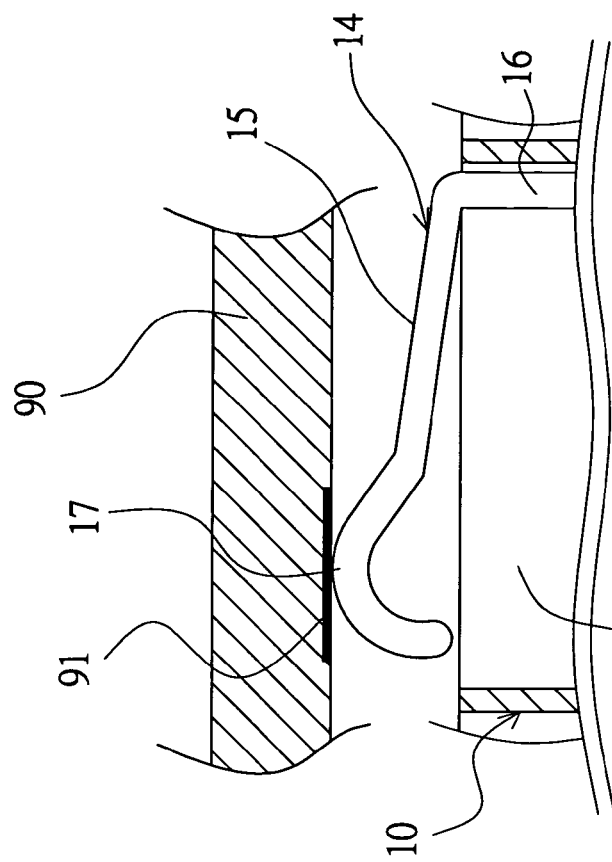
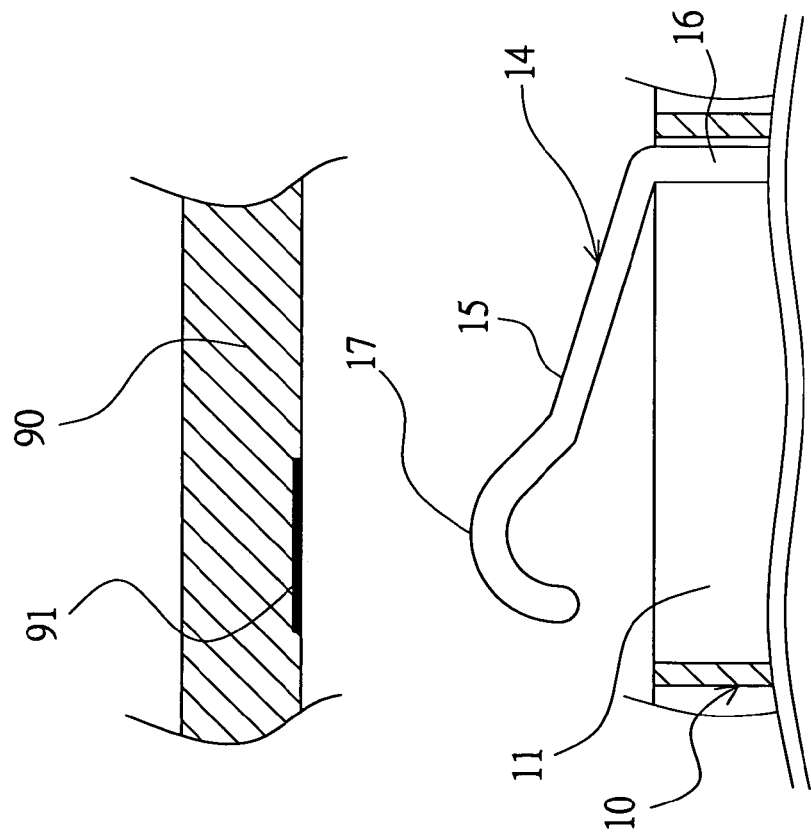

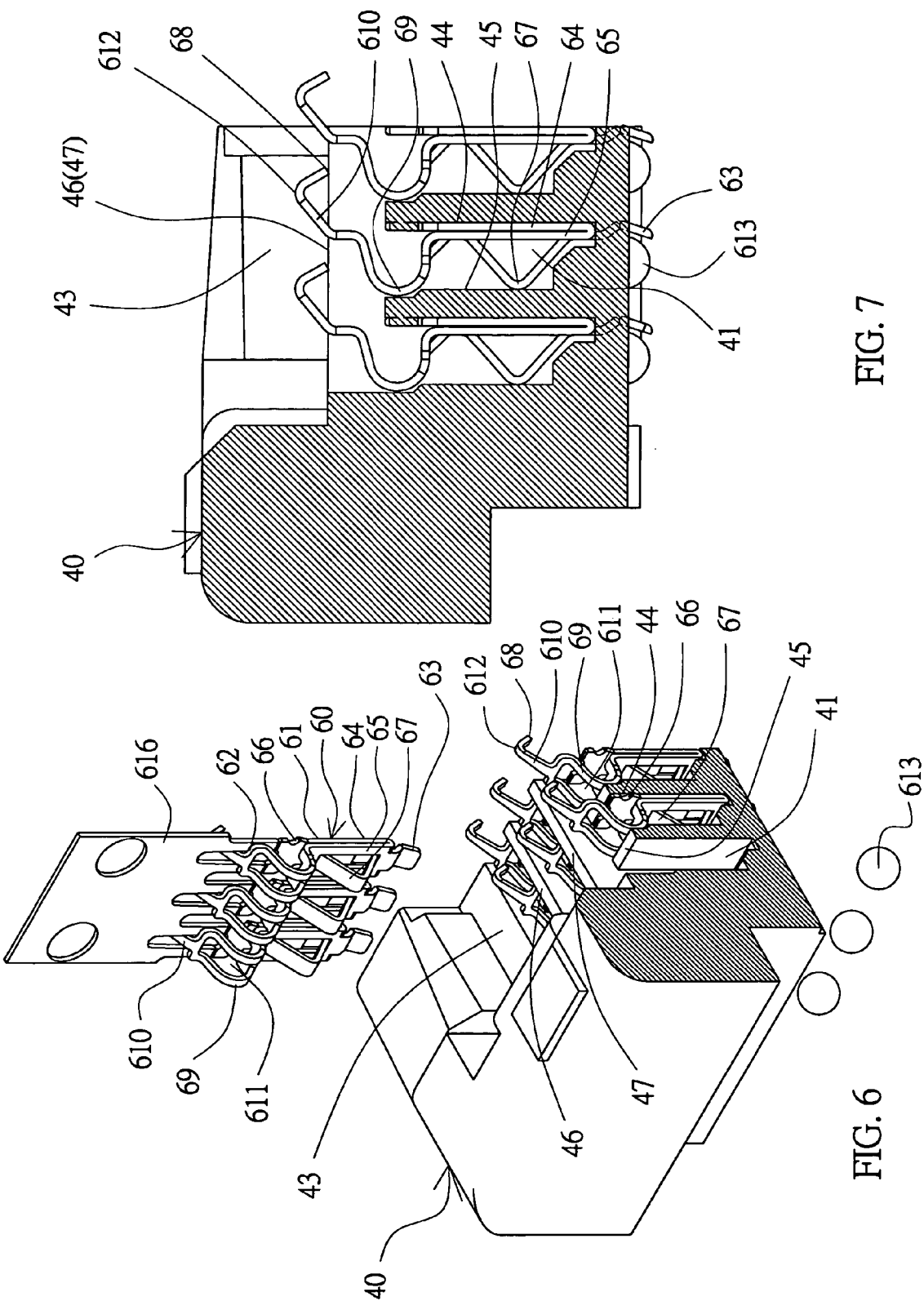

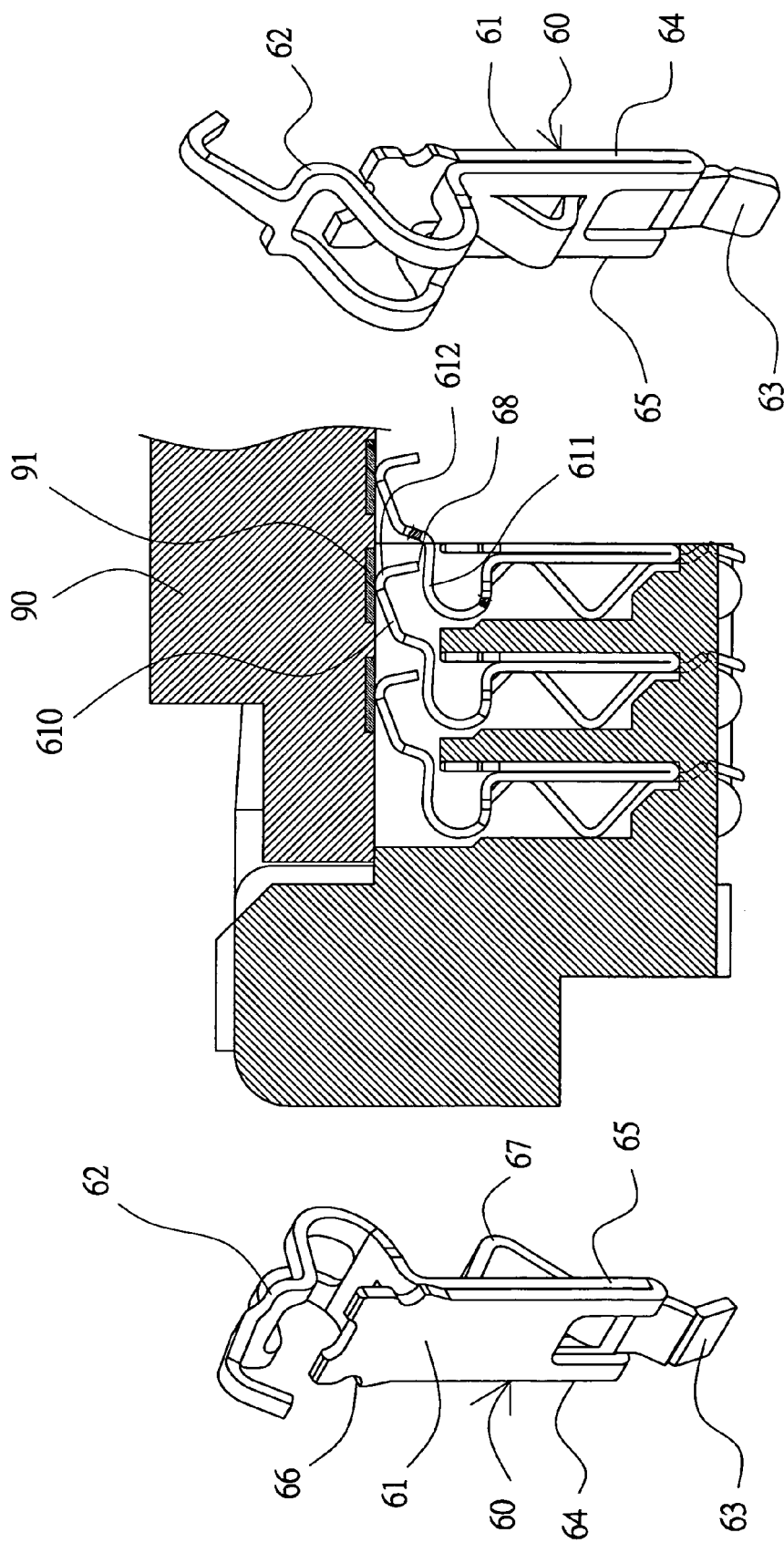

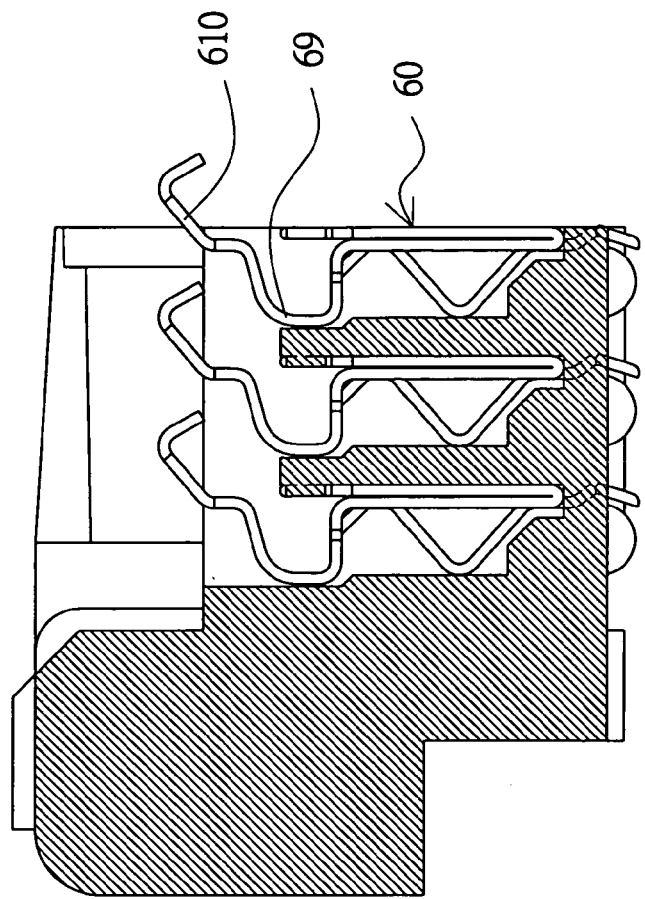
FIG. 13
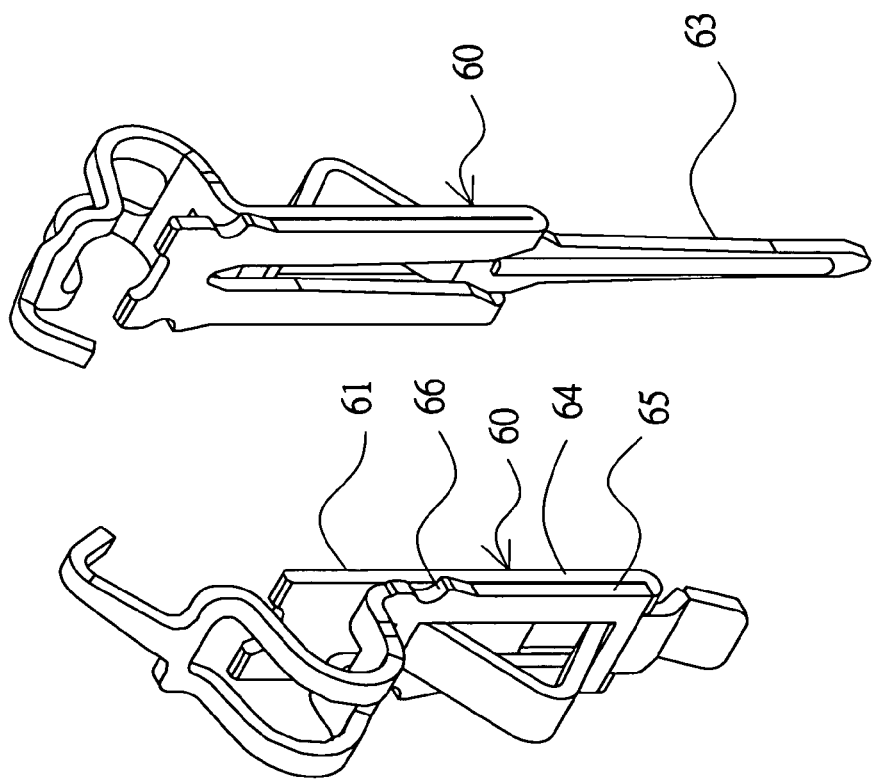
FIG. 12
FIG. 11

ELECTRICAL CONNECTOR HAVING VERTICALLY MOVABLE TERMINALS

BACKGROUND OF THE INVENTION

1. Field of the Invention

The invention relates in general to an electrical connector, and more particularly to an electrical connector having terminals that may be moved vertically.

2. Description of the Related Art

Conventionally, a bottom surface of a chip (e.g., a CPU) is formed with a plurality of connection points arranged separately, and an electrical connector connected to the chip is pressed down to fix the chip onto a base, such that the connection points of the chip may elastically contact the terminals in the terminal slots of the base and the electrical connections therebetween may be ensured.

Referring to FIG. 1, a conventional electrical connector to be connected to a chip includes a base 10, on which a plurality of terminal slots 11 is formed, and a plurality of terminals 14, which is inserted into the terminal slots 11 of the base. Each terminal 14 has a vertically movable elastic arm 15 and a fixing portion 16. The fixing portion 16 presses against the terminal slot 11. The elastic arm 15 is connected to a top of the fixing portion 16 and is formed with a protruding connection point 17 at a free end thereof.

When the chip 90 is placed on the base 10, each connection point 91 of the chip 90 contacts the connection point 17 of each terminal 14. As shown in FIG. 2, when the chip 90 is forced down, each terminal 14 retracts due to the elasticity of the elastic arm 15. At this time, the connection point 17 elastically presses against the connection point 91 to achieve the electrical connection effect.

The prior art structure has the following drawbacks. That is, the terminal slots 11 are rectangular and disposed on the base 10 and the terminals 14 are inserted into the terminal slots 11, so the extendable length of the elastic arm 15 is limited to the length of the terminal slot 11. Because the function of the CPU is getting more and more powerful, the connection points of the CPU are getting more and more. Thus, more and more terminal slots 11 have to be disposed in the base 10 such that the length of the terminal slot is reduced. In this case, the extendable length of the elastic arm 15 of the terminal 14 is also reduced, and the elastic fatigue tends to occur.

SUMMARY OF THE INVENTION

It is therefore an object of the invention to provide an electrical connector having a base and terminals, which may be easily assembled and firmly positioned.

Another object of the invention is to provide an electrical connector including elastic arms of terminals, each of which has an easily controlled length, such that the required elastic moving effect may be achieved.

Still another object of the invention is to provide an electrical connector having adjacent first and second terminals and adjacent first and second terminal slots, in which a free end of an elastic arm of the first terminal in the first terminal slot extends to the second terminal slot. Thus, the elastic arm may have a longer extendable length in the horizontal direction, and the contact elasticity between the chip and the elastic arm may be enhanced.

Yet still another object of the invention is to provide an electrical connector, in which free ends of elastic arms will not be interfered to cause deformations of terminals when a chip is placed in an accommodating region of a base.

To achieve the above-identified objects, the invention provides an electrical connector including a base and a plurality of terminals. The base is formed with a plurality of terminal slots arranged separately. Each of the terminal slots has a first wall and a second wall opposite to the first wall, and a third wall and a fourth wall opposite to the third wall. The terminals are inserted into the plurality of terminal slots of the base. Each of the terminals includes a fixing portion, an elastic arm and a pin portion. The fixing portion presses against the terminal slot and is positioned by the terminal slot. The fixing portion has a first plate and a second plate that are folded and in surface contact with each other. The first plate contacts the first wall of the terminal slot. The elastic arm is connected to a top of the second plate of the fixing portion. The elastic arm extends upward in a direction toward the fixing portion. A connection point is formed on the elastic arm close to a free end of the elastic arm, which is not disposed between the first plate and the second plate. The pin portion, which is formed by prodding and pressing the fixing portion, extends toward a bottom of the base.

According to the above-mentioned structure, the base and the terminals may be easily assembled and firmly positioned, and the length of the elastic arm of the terminal may be easily controlled to achieve the desired elastic moving effect.

Other objects, features, and advantages of the invention will become apparent from the following detailed description of the preferred but non-limiting embodiments. The following description is made with reference to the accompanying drawings.

BRIEF DESCRIPTION OF THE DRAWINGS

FIG. 1 shows a first usage state of a conventional electrical connector and a chip.

FIG. 2 shows a second usage state of the conventional electrical connector and the chip.

FIG. 6 is a pictorially exploded view showing the terminals combined with the inner seat according to the preferred embodiment of the invention.

FIG. 7 is a cross-sectional view showing the terminals combined with the inner seat according to the preferred embodiment of the invention.

FIG. 8 is a pictorial view showing the terminal according to the preferred embodiment of the invention.

FIG. 9 is a schematic illustration showing a usage state according to the preferred embodiment of the invention.

FIG. 10 is a pictorial view showing a terminal according to a second embodiment of the invention.

FIG. 11 is a pictorial view showing a terminal according to a third embodiment of the invention.

FIG. 12 is a pictorial view showing a terminal according to a fourth embodiment of the invention.

FIG. 13 is a cross-sectional view showing terminals combined with an inner seat according to a fifth embodiment of the invention.

DETAILED DESCRIPTION OF THE INVENTION

Figure 3:
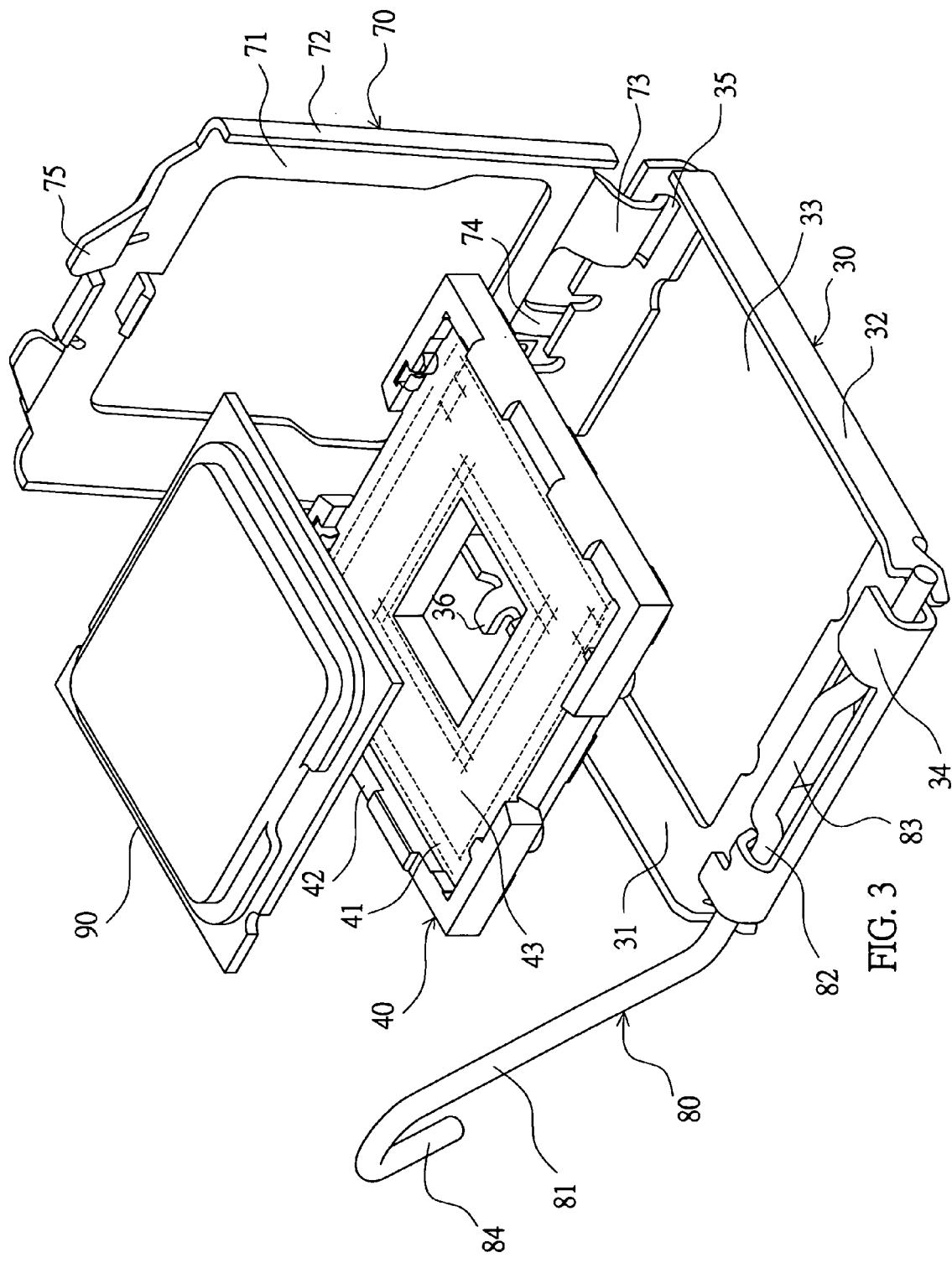
FIG. 3 is a pictorially exploded view showing an electrical connector according to a preferred embodiment of the invention.
Figure 4:
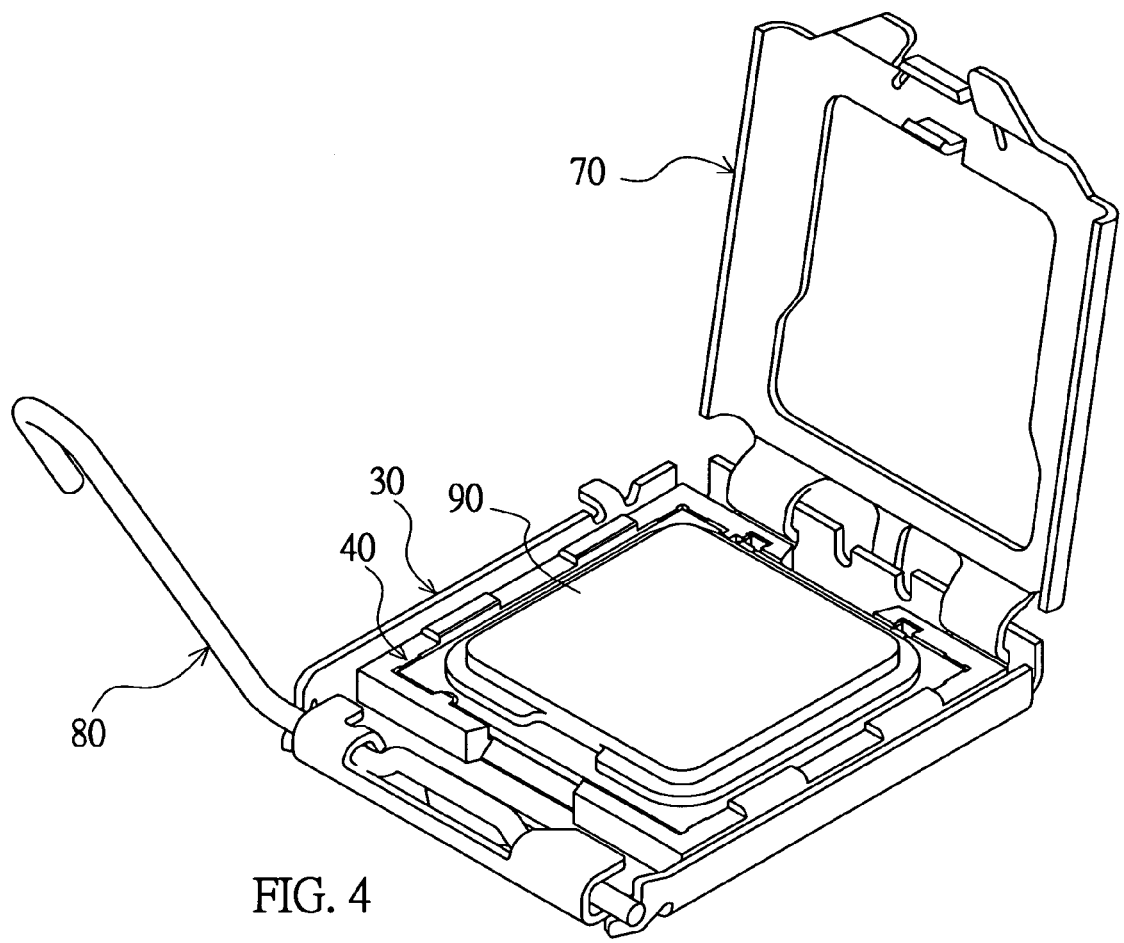
FIG. 4 is a pictorially assembled view showing the electrical connector according to the preferred embodiment of the invention.

Referring to FIGS. 3 to 6, an electrical connector of this embodiment includes a base, a plurality of terminals 60, an upper cover 70 and a lever 80.

The base includes a metallic outer seat 30 and a plastic inner seat 40. The outer seat 30 has a bottom surface 31 and two sidewalls 32. The bottom surface 31 is formed with an opening 33 at a middle portion, a first pivotal portion 34 at a front end, a second pivotal portion 35 being a hole, and an engagement sheet 36 at a side. The inner seat 40 is fitted in the outer seat 30, and a plurality of terminal slots 41 is arranged in the inner seat 40. A periphery of a top of the inner seat is formed with a flange 42 extending upward to form an accommodating region 43 for accommodating a chip 90. As shown in FIGS. 6 and 7, each terminal slot 41 has a first wall 44 and a second wall 45 opposite to the first wall 44, and a third wall 46 and a fourth wall 47 opposite to the third wall 46, wherein the third wall 46 and the fourth wall 47 are higher than the first wall 44 and the second wall 45.

As shown in FIG. 8, the plurality of terminals 60 forming a row is inserted into the terminal slots 41 of the inner seat 40 of the base downward, and then separated from a material tape 616. Each terminal 60 has a fixing portion 61, an elastic arm 62, and a pin portion 63. The fixing portion 61 presses against the terminal slot 41 and is thus positioned and has a first plate 64 and a second plate 65 that are folded and in surface contact with each other. The first plate 64 contacts the first wall 44 of the terminal slot 41 and is formed with a first pressing portion 66 having a wider plate near a top of the first plate 64. The first pressing portion 66 presses against the third wall 46 and the fourth wall 47 of the terminal slot. The second plate 65 is prodded and pressed to form a protruding second pressing portion 67 to press against the second wall 45 of the terminal slot. The elastic arm 62 is connected to a top of the second plate 65 of the fixing portion 61. The elastic arm 62 firstly extends toward the second wall 45 and then turns back and extends upward in a slantingly direction toward the fixing portion. A free end 68 of a first terminal 60, which is inserted into a first terminal slot 41, strides over the first wall 44 and then goes to a location above the second terminal slot 41, in which a second terminal 60 adjacent to the first terminal 60 is disposed. The elastic arm 62 has a wider lower section 69 and a narrower upper section 610. The lower section 69 has an arc shape and is formed with an opening 611 at a middle portion. The free end of the upper section 610 of the elastic arm of a first terminal in a first terminal slot is located above and corresponds to the opening 611 of the lower section 69 of the elastic arm of a second terminal in a second terminal slot adjacent to the first terminal slot. The free end of the first terminal never contacts the second terminal in the second terminal slot adjacent to the first terminal slot because the free end of the first terminal may be moved into the opening of the second terminal. In addition, a highest connection point 612, which is higher than the third wall and the fourth wall 47 of the terminal slot and located in the accommodating region 43, is formed on the upper section 610 of the elastic arm close to the free end 68, which is not disposed between the first plate 64 and the second plate 65. The free end 68 of the elastic arm is flush with the third wall 46 and the fourth wall 47. The pin portion 63 to be connected to a solder ball 613 is formed by prodding and pressing the first plate 64 of the fixing portion 61 and extends downward to a bottom of the inner seat 40.

The upper cover 70 has a covering surface 71 and two sidewalls 72. Two sides of the rear end of the upper cover 70 are formed with an arced pivotal portion 73. The middle of the rear end of the upper cover 70 is formed with a stopper 74. The pivotal portion 73 is pivotably connected to the second pivotal portion 35 at the rear end of the outer seat 30 of the base. A front end of the upper cover 70 is formed with two protruding sheets 75, which extend frontward in a transversal state. When the upper cover 70 covers the base, the covering surface 71 can press the periphery of the chip 90. In addition, when the upper cover 70 is lifted up into a longitudinal state, the stopper 74 can stop the rear end of the inner seat 40 and prevent the inner seat 40 from falling out.

Figure 5:
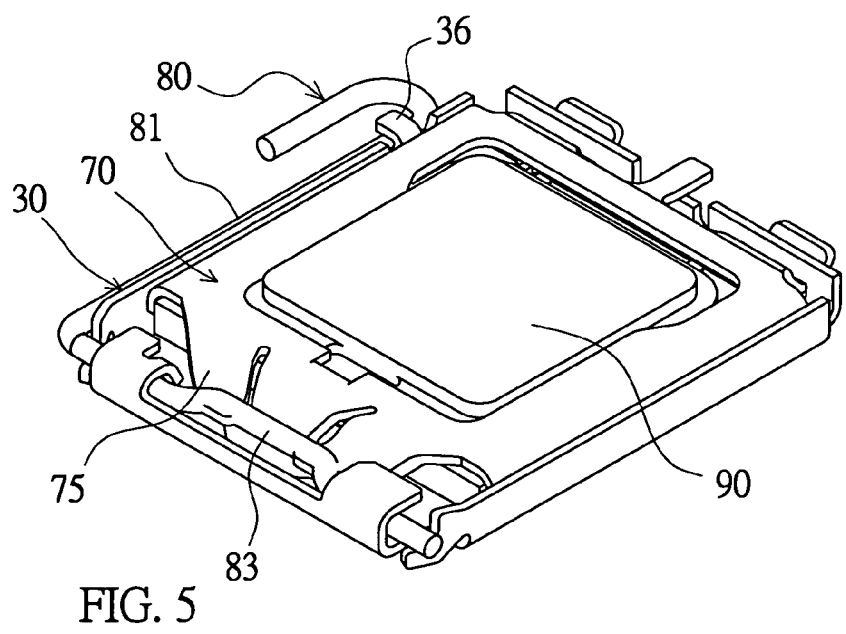
FIG. 5 is a pictorial view showing a usage state of the electrical connector according to the preferred embodiment of the invention.

The lever 80 has a first rod 81 and a second rod 82 perpendicular to the first rod. The second rod 82 is pivotably connected to the first pivotal portion 34 at the front end of the outer seat 30 of the base, and is bent to form a convex rod 83. An external end of the first rod 81 is bent to form a handle 84. When the first rod 81 is swung toward the rear end of the base, the convex rod 83 can press the protruding sheet 75 of the upper cover 70 to make the upper cover 70 press the chip 90 downward and to make the terminals 60 be electrically connected to the chip 90. As shown in FIG. 5, when the lever 80 is swung and positioned, the first rod 81 is engaged under the engagement sheet 36 of the outer seat 30.

According to the above-mentioned structure, because the elastic arm 62 of the terminal 60 extends to the adjacent terminal slot 41, the elastic arm 62 may have good elasticity. As shown in FIG. 9, when the chip 90 is pressed by the upper cover 70 to contact the terminals, the elastic arm 62 of each of the terminals retracts elastically, and the connection point 612 may elastically contact the connection point 91 of the chip 90. The elastic arm 62 of the terminal extends slantingly from bottom to top and is free from contacting the adjacent terminal in the adjacent terminal slot 41 to cause the short-circuited condition. Because the upper section 610 of the elastic arm is located above the opening 611 of the lower section of the elastic arm of the terminal in the adjacent terminal slot, the upper section 610 of one terminal can be moved into the opening 611 of another adjacent terminal and never contacts the adjacent terminal when the elastic arm 62 is pressed.

Thus, the invention has the following advantages.

1. The fixing portion of the terminal has the first plate 64 and the second plate 65 that are folded, so the first plate 64 may have a wider pressing portion 66 for pressing against the third and fourth walls 46 and 47 of the terminal slot, and the pressing portion 61 for pressing against the second wall 45 of the terminal slot may be formed by prodding and pressing a plate surface of the second plate 65. Thus, the terminals may be easily assembled and well positioned. In addition, the first plate 64 may have good structure intensity because the pressing portion of the first plate 64 is not formed by way of pressing.

2. The length of the elastic arm 62 may be controlled according to the length of the second plate 65 of the fixing portion of the terminal. That is, the shorter the second plate 65 is, the lower the root of the elastic arm 62 is, and the larger the elastic movement is. Otherwise, the elastic movement of the elastic arm 62 is smaller.

3. The free end of the elastic arm 62 of the terminal extends to the adjacent terminal slot 41, so the elastic arm may have a longer extending length in the horizontal direction and the contact between the chip and the elastic arm is better. In addition, the elastic arm extends slantingly from bottom to top. So, when the chip presses the elastic arm, the elastic arm never contacts the adjacent terminal to cause the short-circuited condition.

The lower section 69 of the elastic arm has the opening 611 for receiving the upper section 610 of the adjacent terminal. Although the free end 68 of the elastic arm is bent downward to flush with the third and fourth walls 46 and 47, it is unnecessary to worry about that the free end will contact the adjacent terminal. In addition, because the free end 68 of the elastic arm is not higher than the third and fourth walls 46 and 47, the chip 90 never interferes with the free end 68 of the elastic arm to cause the deformation of the terminal when the chip is placed in the accommodating region 43.

As shown in FIG. 10, the second embodiment of the invention is almost the same as the first embodiment except that the pin portion 63 of the terminal 60 is formed by pressing the second plate of the fixing portion.

As shown in FIG. 11, the third embodiment of the invention is almost the same as the first embodiment except that the first pressing portions 66 of the fixing portion 61 of the terminal 60 are formed at two sides of the top of the second plate 65.

As shown in FIG. 12, the fourth embodiment of the invention is almost the same as the first embodiment except that the pin portion 63 of the terminal 60 extends longitudinally.

As shown in FIG. 13, the fifth embodiment of the invention is almost the same as the first embodiment except that the lower section 69 of the elastic arm of the terminal 60 has a ⊂ shape.

While the invention has been described by way of examples and in terms of preferred embodiments, it is to be understood that the invention is not limited to the disclosed embodiments. To the contrary, it is intended to cover various modifications. Therefore, the scope of the appended claims should be accorded the broadest interpretation so as to encompass all such modifications.

What is claimed is:

1. An electrical connector, comprising:
   a base formed with a plurality of terminal slots arranged separately, each of the terminal slots has a first wall and a second wall opposite to the first wall, and a third wall and a fourth wall opposite to the third wall; and
   a plurality of terminals respectively inserted into the plurality of terminal slots of the base, each of the terminals comprising:
   a fixing portion for pressing the terminal slot and being positioned by the terminal slot, wherein the fixing portion has a first plate and a second plate that are folded and in surface contact with each other, the first plate contacts the first wall of the terminal slot;
   an elastic arm connected to a top of the second plate of the fixing portion, wherein the elastic arm extends upward in a direction toward the fixing portion, and a connection point is formed on the elastic arm close to a free end of the elastic arm, which is not disposed between the first plate and the second plate; and
   a pin portion, which is connected to the fixing portion and extends toward a bottom of the base.

2. The connector according to claim 1, wherein the first plate of the fixing portion of the terminal has a wider pressing portion for pressing against the third wall and the fourth wall of the terminal slot.

3. The connector according to claim 1, wherein a protruding pressing portion for pressing against the second wall of the terminal slot is connected to the second plate of the fixing portion of the terminal.

4. The connector according to claim 1, wherein the pin portion of the terminal is connected to a solder ball.

5. The connector according to claim 1, wherein the pin portion of the terminal is connected to the first plate of the fixing portion.

6. The connector according to claim 1, wherein:
   the terminals comprise a first terminal and a second terminal adjacent to the first terminal;
   the terminal slots comprise a first terminal slot, into which the first terminal is inserted, and a second terminal slot, into which the second terminal is inserted;
   the free end of the elastic arm of the first terminal strides over the first wall and goes to a location above the second terminal slot.

7. The connector according to claim 6, wherein the elastic arm of each of the first and second terminals has a wider lower section and a narrower upper section, the lower section is formed with an opening, a free end of the upper section of the elastic arm of the first terminal is located above and corresponds to the opening of the lower section of the elastic arm of the second terminal such that the free end of the first terminal never contacts the second terminal.

8. The connector according to claim 6, wherein the third and fourth walls of each of the first and second terminal slots are higher than the first and second walls.

9. The connector according to claim 8, wherein the free end of the elastic arm of each of the first and second terminals is not higher than the third and fourth walls of each of the first and second terminal slots, and the connection point of the elastic arm is higher than the third and fourth walls of each of the first and second terminal slots.

10. The connector according to claim 1, wherein:
    a top of the base is formed with an accommodating region for accommodating a chip;
    the connection points of the plurality of terminals protrude from the terminal slot to the accommodating region; and
    the connector further comprises:
    an upper cover having a rear end pivotably connected to a rear end of the base, and a front end formed with a protruding sheet, wherein the upper cover presses the chip when the upper cover is closed on the base; and
    a lever having a first rod and a second rod perpendicular to the first rod, wherein the second rod is pivotably connected to a front end of the base and bent to form a convex rod, which presses the protruding sheet of the upper cover when the first rod is swung toward the rear end of the base.

11. The connector according to claim 10, wherein the base comprises a metallic outer seat and a plastic inner seat fit into the outer seat, the plurality of terminal slots and the accommodating region are disposed on the inner seat, and the lever and the upper cover are respectively pivotably connected to a front end and a rear end of the outer seat.

* * * * *